United States Patent
Liao

(10) Patent No.: US 11,894,644 B2
(45) Date of Patent: Feb. 6, 2024

(54) ADAPTER HOUSING AND ADAPTER

(71) Applicant: Guangdong Gopod Group Holding Co., Ltd., Shenzhen (CN)

(72) Inventor: Zhuowen Liao, Shenzhen (CN)

(73) Assignee: Guangdong Gopod Group Holding Co., Ltd., Shenzhen (CN)

( * ) Notice: Subject to any disclaimer, the term of this patent is extended or adjusted under 35 U.S.C. 154(b) by 462 days.

(21) Appl. No.: 17/286,236

(22) PCT Filed: Oct. 16, 2018

(86) PCT No.: PCT/CN2018/110503
§ 371 (c)(1),
(2) Date: Apr. 16, 2021

(87) PCT Pub. No.: WO2020/077537
PCT Pub. Date: Apr. 23, 2020

(65) Prior Publication Data
US 2021/0344150 A1   Nov. 4, 2021

(51) Int. Cl.
*H01R 13/506* (2006.01)
*H01R 31/06* (2006.01)
*H05K 5/02* (2006.01)

(52) U.S. Cl.
CPC ......... *H01R 31/065* (2013.01); *H01R 13/506* (2013.01); *H05K 5/0278* (2013.01)

(58) Field of Classification Search
CPC ... H01R 31/065; H01R 13/506; H05K 5/0278
(Continued)

(56) References Cited

U.S. PATENT DOCUMENTS 5,402,095 A * 3/1995 Janniere ............ G06K 13/0831
220/348
6,939,179 B1 9/2005 Kieffer, Jr. et al.
(Continued)

FOREIGN PATENT DOCUMENTS

CN   200990440 Y   12/2007
CN   201041862 Y   3/2008
(Continued)

OTHER PUBLICATIONS

International Search Report and Written Opinion for International Application No. PCT/CN2018/110503 dated Jul. 18, 2019, together with an English-language translation.

*Primary Examiner* — Timothy J Thompson
*Assistant Examiner* — Michael F McAllister

(57) ABSTRACT

The present application relates to the technical field of adapter devices, and in particular to an adapter shell and an adapter. The adapter shell, used for providing a circuit board, comprises: a first shell, a second shell and a sliding plate. The first shell comprises a first bottom plate and a first annular lateral plate. The second shell comprises a second bottom plate and a second annular lateral plate. The sliding plate is movably connected to the second bottom plate, and the sliding plate and the second annular lateral plate are respectively positioned on two sides of the second bottom plate. The first annular lateral plate and the second annular lateral plate are detachably connected to each other in a sleeved manner to form a placing cavity for providing the circuit board.

15 Claims, 4 Drawing Sheets

(58) Field of Classification Search
USPC .......................................................... 361/737
See application file for complete search history.

(56) References Cited

U.S. PATENT DOCUMENTS

| | | | |
|---|---|---|---|
| 7,766,660 B1 | 8/2010 | Chang | |
| 7,859,850 B2* | 12/2010 | Chan | .................... G06K 7/0021 |
| | | | 439/945 |
| 2007/0253174 A1* | 11/2007 | Gu | ....................... H01R 12/722 |
| | | | 174/359 |

FOREIGN PATENT DOCUMENTS

| CN | 303691250 S | 6/2016 |
|---|---|---|
| CN | 304400127 S | 12/2017 |

* cited by examiner

ADAPTER HOUSING AND ADAPTER

RELATED APPLICATIONS

This Application is a national stage filing under 35 U.S.C. 371 of International Patent Application Serial No. PCT/CN2018/110503, filed Oct. 16, 2018 which is incorporated herein by reference in its entirety.

TECHNICAL FIELD

The present application relates to the technical field of adapter devices, and in particular to an adapter shell and an adapter.

BACKGROUND OF THE INVENTION

Currently, an adapter is used for connecting a USB flash disk or a solid state storage chip to a computer or a mobile phone. The adapter is generally provided with an integrally formed shell, the USB flash disk or the solid state storage chip is plugged at one end of the adapter, and the other end of the adapter is plugged into the computer or the mobile phone, thus making it easy for the computer or the mobile phone to read the USB flash disk or the solid state storage chip. The integrally formed shell is beneficial for a compact and stable operation of the adapter.

However, the integrally formed shell is not conducive to interior cleaning and parts maintenance of the adapter.

SUMMARY OF THE INVENTION

An object of the present application is to provide an adapter shell, aiming to solve the problems of inconvenience of cleaning and maintaining and changing means stored in the adapter shell in that the adapter shell is non-detachable.

The present application is achieved as follows: an adapter shell, used for providing a circuit board, comprising:

a first shell, comprising a first bottom plate and a first annular lateral plate connected to the first bottom plate;

a second shell, comprising a second bottom plate and a second annular lateral plate connected to the second bottom plate; and a sliding plate movably connected to the second bottom plate, the sliding plate and the second annular lateral plate being respectively positioned on two sides of the second bottom plate;

wherein the first annular lateral plate and the second annular lateral plate are detachably connected to each other in a sleeved manner, the first annular lateral plate and the second annular lateral plate are positioned between the first bottom plate and the second bottom plate to form a placing cavity for providing the circuit board; and a plate face of the second bottom plate is provided with a communication hole in communication with the placing cavity and used for taking and placing parts, and the sliding plate detachably covers a hole opening of the communication hole.

Further, the adapter shell further comprises a buckle structure, and the buckle structure detachably connects the first annular lateral plate and the second annular lateral plate.

Further, the buckle structure comprises a plurality of female buckles provided on an inner lateral wall of the first annular lateral plate and a plurality of male buckles provided on an outer lateral wall of the second annular lateral plate in a protruding manner, wherein the male buckles are adapted to and in snap connection, on a one-to-one basis, to the female buckles.

Further, the plate face of the second bottom plate is provided with a placing groove, the hole opening of the communication hole is positioned at a groove bottom of the placing groove, and the sliding plate is provided in the placing groove and can slide in a reciprocating manner in an extension direction of the placing groove so as to open or close the communication hole.

Further, groove walls on two sides of the placing groove are provided with a sliding groove, an extension direction of the sliding groove is the same as the extension direction of the placing groove, the sliding plate comprises a plate body and two sliding blocks provided on two sides of the plate body in a protruding manner, and the sliding blocks are slidably connected to the respective sliding grooves, respectively.

Further, groove bottoms of the sliding grooves are provided with positioning protrusion points in a protruding manner, and the sliding blocks are provided with positioning pockets adapted to the positioning protrusion points.

Further, the groove width of the sliding groove is less than the plate thickness of the plate body.

Further, an outwardly provided plate face of the plate body is flush with an outwardly provided plate face of the second bottom plate.

Further, the plate body is provided with a shift block part used for shifting the plate body.

Further, the first bottom plate and the second annular lateral plate enclose and form a first accommodating cavity, a cavity opening of the first accommodating cavity is provided with a limiting annular groove, and circumferential plate edges of the second bottom plate abut against the groove bottom of the limiting annular groove towards the top.

Further, the first annular lateral plate is provided with a charging interface for plugging of an external power supply.

Further, the first annular lateral plate is further provided with a high-definition multimedia interface for plugging of an external display device, and the high-definition multimedia interface and the charging interface are positioned on the same side of the adapter shell.

Further, the first annular lateral plate is further provided with a plurality of USB interfaces for plugging of an external flash memory device, and the USB interfaces are positioned between the charging interface and the high-definition multimedia interface.

The present embodiment further provides an adapter, which comprises the adapter shell as mentioned above, the circuit board provided in the placing cavity, a solid state storage chip positioned in the placing cavity and detachably connected to the circuit board, a plug for connecting the circuit board to an external device, and a cable connecting the plug and the circuit board.

Further, the adapter further comprises a support shell, and the support shell is positioned in the placing cavity and is detachably connected to the second lateral plate and used for fixing and supporting the circuit board.

The present application has the following technical effects: the first shell and the second shell are detachably connected to each other, and specifically, the first bottom plate, the first annular lateral plate, the second annular lateral plate and the second bottom plate are sequentially connected. The first annular lateral plate and the second annular lateral plate are detachably connected to each other in a sleeved manner, thus the first shell and the second shell enclosing and forming the placing cavity. The communication hole is provided in the second bottom plate and is in communication with the placing cavity, and the sliding plate detachably covers a connection hole. The parts in the placing cavity can be cleaned and maintained via the communication hole after the sliding plate is opened.

Figure 1:
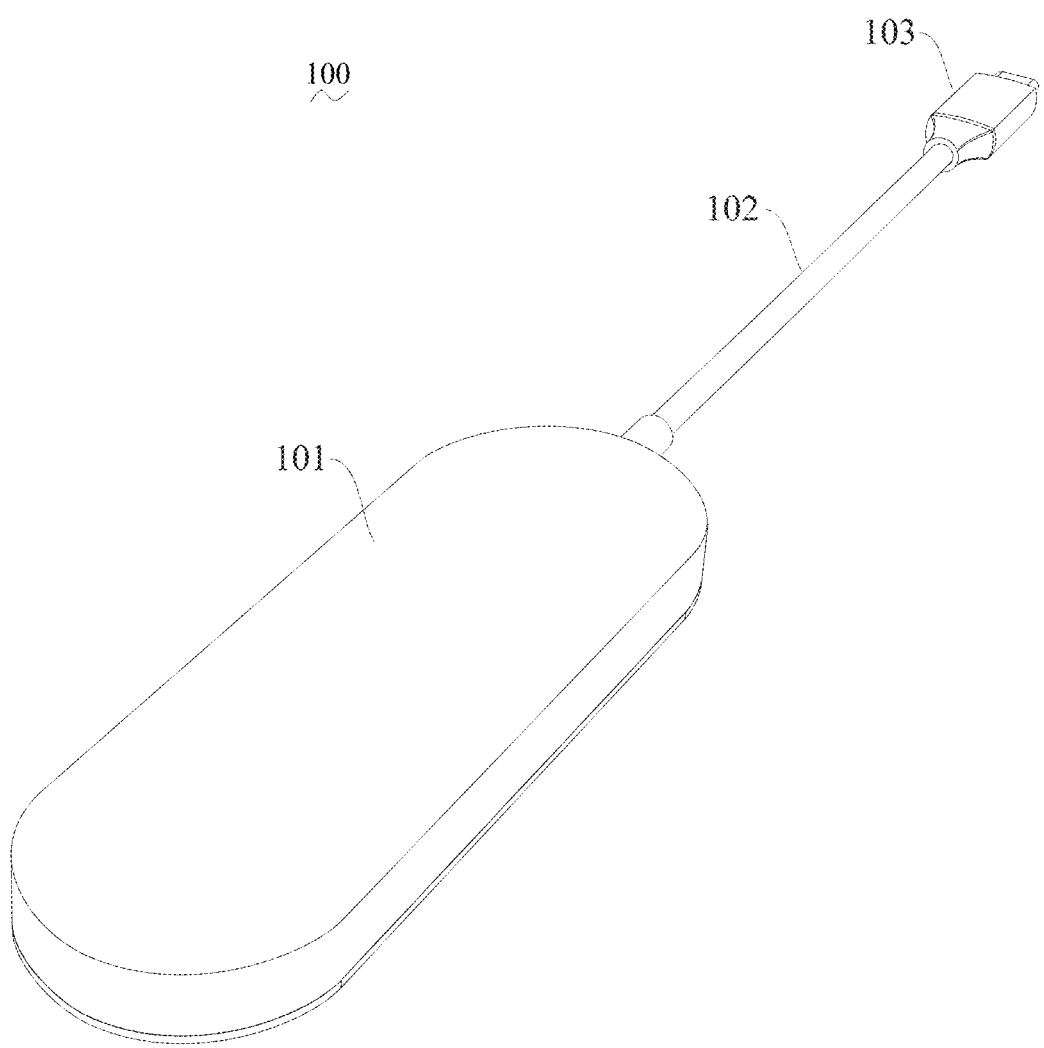
FIG. 1 is a schematic structural diagram of an adapter provided in an embodiment of the present application.

The relationships between reference numerals and names in the drawings are as follows:

100. Adapter; 101. Adapter shell; 102. Cable; 103. Plug; 10. First shell; 20. Second shell; 30. Sliding plate; 31. Plate body; 32. Sliding block; 60. Placing cavity; 33. Shift block part; 21. Second bottom plate; 22. Second annular lateral plate; 23. Placing groove; 28. Communication hole; 24. Male buckle; 50. Circuit board; 40. Support shell; 11. First bottom plate; 12. First annular lateral plate; 14. Limiting annular groove; 15. Female buckle; 16. Charging interface; 17. USB interface; 18. High-definition multimedia interface; 111. First accommodating cavity; 321. Positioning pocket.

DETAILED DESCRIPTION OF EMBODIMENTS

Embodiments of the present application will be described below in detail, and examples of the embodiments are shown in the drawings, wherein the same or similar reference numerals throughout the drawings represent the same or similar elements or the elements having the same or similar functions. The embodiments described below with reference to the accompanying drawings are exemplary and are intended to be illustrative of the present application, and will not be interpreted as limiting the present application.

Figure 2:
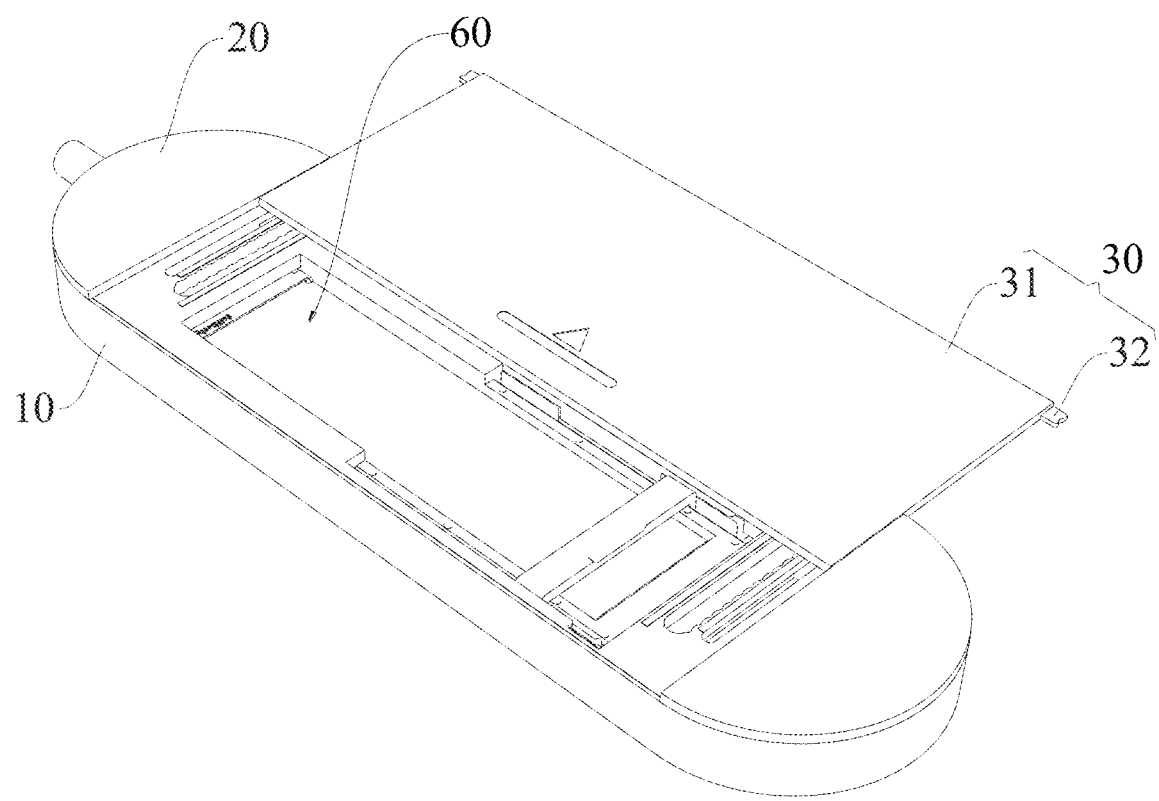
FIG. 2 is a schematic structural diagram of a sliding plate of the adapter in FIG. 1 in an opened state.
Figure 3:
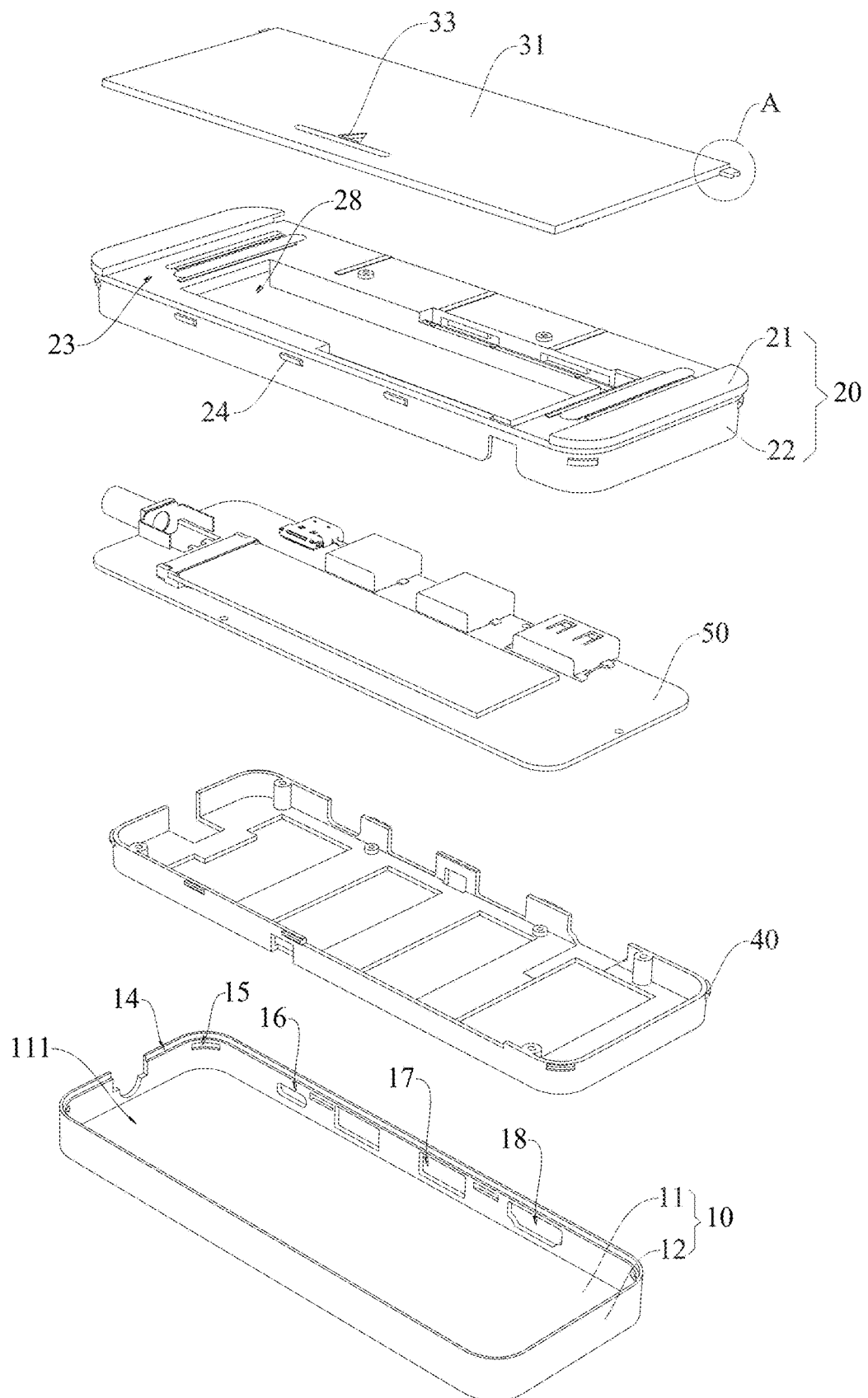
FIG. 3 is an exploded diagram of the adapter in FIG. 1.

With reference to FIG. 1 to FIG. 3, the embodiment of the present application provides an adapter shell 101 and an adapter 100 having same. The adapter 100 is used for connecting a portable storage device to a computer or to a mobile phone. The adapter shell 101 has the characteristic of being detachable and thus facilitates interior cleaning and parts maintenance of the adapter 100.

The adapter 100 comprises the adapter shell 101, a circuit board 50 provided in a placing cavity 60, a solid state storage chip connected to the circuit board 50, a plug 103 connecting the circuit board 50 to an external device, and a cable 102 connecting the plug 103 and the circuit board 50.

The adapter shell 101, used for placing the circuit board 50, comprises: a first shell 10, a second shell 20 and a sliding plate 30. The first shell 10 comprises a first bottom plate 11 and a first annular lateral plate 12 connected to the first bottom plate 11. Optionally, the first bottom plate 11 is a rectangular plate, and the shape of the first annular lateral plate 12 is adapted to the first bottom plate 11. In the present embodiment, the first bottom plate 11 and the first annular lateral plate 12 are integrally formed by injection moulding through a plastic material. The second shell 20 comprises a second bottom plate 21 and a second annular lateral plate 22 connected to the second bottom plate 21. Optionally, the second bottom plate 21 is a rectangular plate, and the shape of the second annular lateral plate 22 is adapted to the second bottom plate 21. In the present embodiment, the second bottom plate 21 and the second annular lateral plate 22 are integrally formed by injection moulding through a plastic material. The sliding plate 30 is movably connected to the second bottom plate 21, and the sliding plate 30 and the second annular lateral plate 22 are respectively positioned on two sides of the bottom plate. Optionally, the sliding plate 30 is also integrally formed by injection moulding through a plastic material. The first annular lateral plate 12 and the second annular lateral plate 22 are detachably connected to each other in a sleeved manner, i.e., the first annular lateral plate 12 is sleeved with the second annular lateral plate 22, or the second annular lateral plate 22 is sleeved with the first annular lateral plate 12. In the present embodiment, the first annular lateral plate 12 is sleeved with the second annular lateral plate 22. The first annular lateral plate 12 and the second annular lateral plate 22 are positioned between the first bottom plate 11 and the second bottom plate 21 to form a placing cavity 60 for providing the circuit board 50. A plate face of the second bottom plate 21 is provided with a communication hole 28 in communication with the placing cavity 60 and used for taking and placing parts, and the sliding plate 30 detachably covers a hole opening of the communication hole 28.

With reference to FIG. 1 to FIG. 3, the present application has the following technical effects: the first shell 10 and the second shell 20 are detachably connected to each other, and specifically, the first bottom plate 11, the first annular lateral plate 12, the second annular lateral plate 22 and the second bottom plate 21 are sequentially connected. The first annular lateral plate 12 and the second annular lateral plate 22 are detachably connected to each other in a sleeved manner, thus the first shell 10 and the second shell 20 enclosing and forming the placing cavity 60. The communication hole 28 is provided in the second bottom plate 21 and is in communication with the placing cavity 60, and the sliding plate 30 detachably covers a connection hole. The parts in the placing cavity 60 can be cleaned and maintained via the communication hole 28 after the sliding plate 30 is opened.

The adapter shell 101 further comprises a buckle structure, and the first annular lateral plate 12 and the second annular lateral plate 22 are detachably connected to each other in a sleeved manner via the buckle structure. The buckle structure can detachably connect the first shell 10 and the second shell 20, thus facilitating subsequent maintenance and cleaning.

The buckle structure comprises a plurality of female buckles 15 provided on an inner lateral wall of the first annular lateral plate 12 and a plurality of male buckles 24 provided on an outer lateral wall of the second annular lateral plate 22 in a protruding manner, wherein the male buckles 24 are adapted to and in snap connection, on a one-to-one basis, to the female buckles 15. Optionally, the female buckle 15 is of a square groove structure, and one end of the male buckle 24 is buckled into the square groove to connect the first shell 10 and the second shell 20.

With reference to FIG. 1 to FIG. 3, the plate face of the second bottom plate 21 is provided with a placing groove 23, the hole opening of the communication hole 28 is positioned at a groove bottom of the placing groove 23, and the sliding plate 30 is provided in the placing groove 23 and can slide in a reciprocating manner in an extension direction of the placing groove 23 so as to open or close the communication hole 28. The sliding plate 30 is provided in the placing groove 23, thus facilitating decrease of the overall thickness of the adapter shell 101, being convenient to carry the adapter 100, and occupying a small space.

Groove walls on two sides of the placing groove 23 are provided with a sliding groove, an extension direction of the sliding groove is the same as the extension direction of the placing groove 23, the sliding plate 30 comprises a plate body 31 and two sliding blocks 32 provided on two sides of the plate body 31 in a protruding manner, and the sliding blocks 32 are slidably connected to the respective sliding grooves, respectively. The two sliding blocks 32 slide in the sliding grooves to guide the plate body 31 to open or close the communication hole 28, improving sliding stability of the sliding plate 30.

Figure 4:
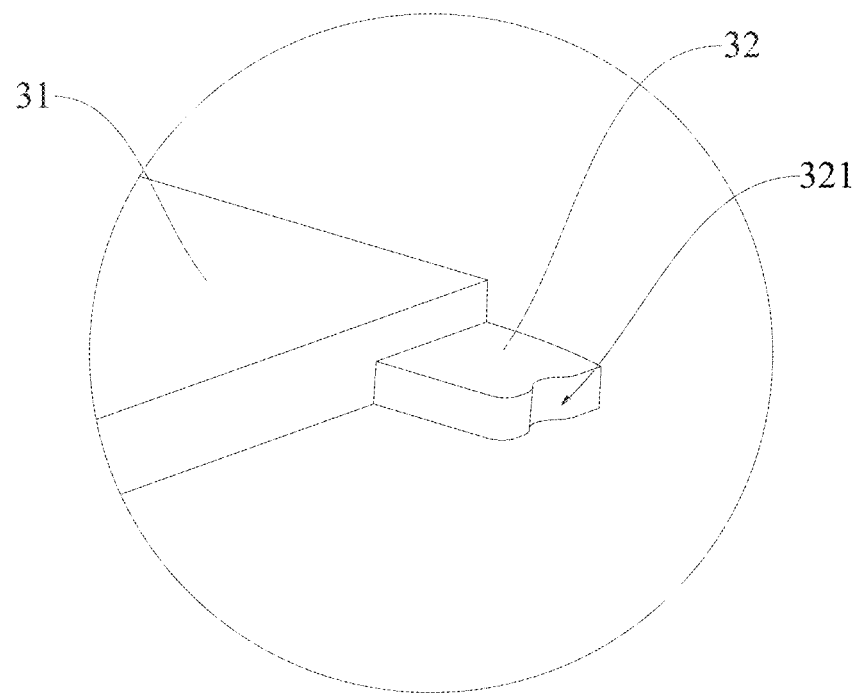
FIG. 4 is a partially enlarged diagram of the position A in FIG. 3.

With reference to FIG. 4, groove bottoms of the sliding grooves are provided with positioning protrusion points in a protruding manner, and the sliding blocks 32 are provided with positioning pockets 321 adapted to the positioning protrusion points. The position where the positioning pocket 321 is provided is adapted to the position of the positioning protrusion point, i.e., after the sliding plate 30 slides in the placing groove 23 to close the communication hole 28, the positioning protrusion points are clamped in the corresponding positioning pockets 321, thus improving stability of the sliding plate 30 in the placing groove 23 in this state.

The groove width of the sliding groove is less than the plate thickness of the plate body 31, and the plate body 31 abuts against the groove wall of the placing groove 23, such that the second bottom plate 21 is tightly connected to the sliding plate 30.

An outwardly provided plate face of the plate body 31 is flush with an outwardly provided plate face of the second bottom plate 21. The plate face of the plate body 31 is flush with the plate face of the second bottom plate 21, and when the adapter shell 101 is placed on a table, it is beneficial to improve the stability of the adapter 100.

With reference to FIG. 1 to FIG. 3, the plate body 31 is provided with a shift block part 33 used for shifting the plate body 31, and the shift block part 33 is conductive to increasing friction between a human hand and the sliding plate 30, and is easy to be detached.

The first bottom plate 11 and the second annular lateral plate 22 enclose and form a first accommodating cavity 111, a cavity opening of the first accommodating cavity 111 is provided with a limiting annular groove 14, and circumferential plate edges of the second bottom plate 21 abut against the groove bottom of the limiting annular groove 14 towards the top. The limiting annular groove 14 is provided in an inner cavity wall of the first accommodating cavity 111 and is in an L shape, and circumferential lateral plate faces of the second bottom plate 21 abut against the groove wall of the limiting annular groove 14, i.e., the second bottom plate 21 is embedded in the limiting annular groove 14.

The placing cavity 60 comprises the first accommodating cavity 111 and a second accommodating cavity. The second accommodating cavity is enclosed by the second bottom plate 21 and the second annular lateral plate 22, and the communication hole 28 is in communication with the second accommodating cavity.

The first annular lateral plate 12 is provided with a charging interface 16 for plugging of an external power supply. The placing cavity 60 is internally provided with a rechargeable power supply used for supplying power to the circuit board 50, and the rechargeable power supply can be charged via the charging interface 16. The charging interface 16 is a TYPE-C interface.

The first annular lateral plate 12 is further provided with a high-definition multimedia interface 18 for plugging of an external display device, and the high-definition multimedia interface 18 and the charging interface 16 are positioned on the same side of the adapter shell 101. The adapter 100 can be connected to an external display via the high-definition multimedia interface 18, and therefore content in a computer or a mobile phone is projected into the display, further improving the convenience of the adapter 100.

Figure 5:
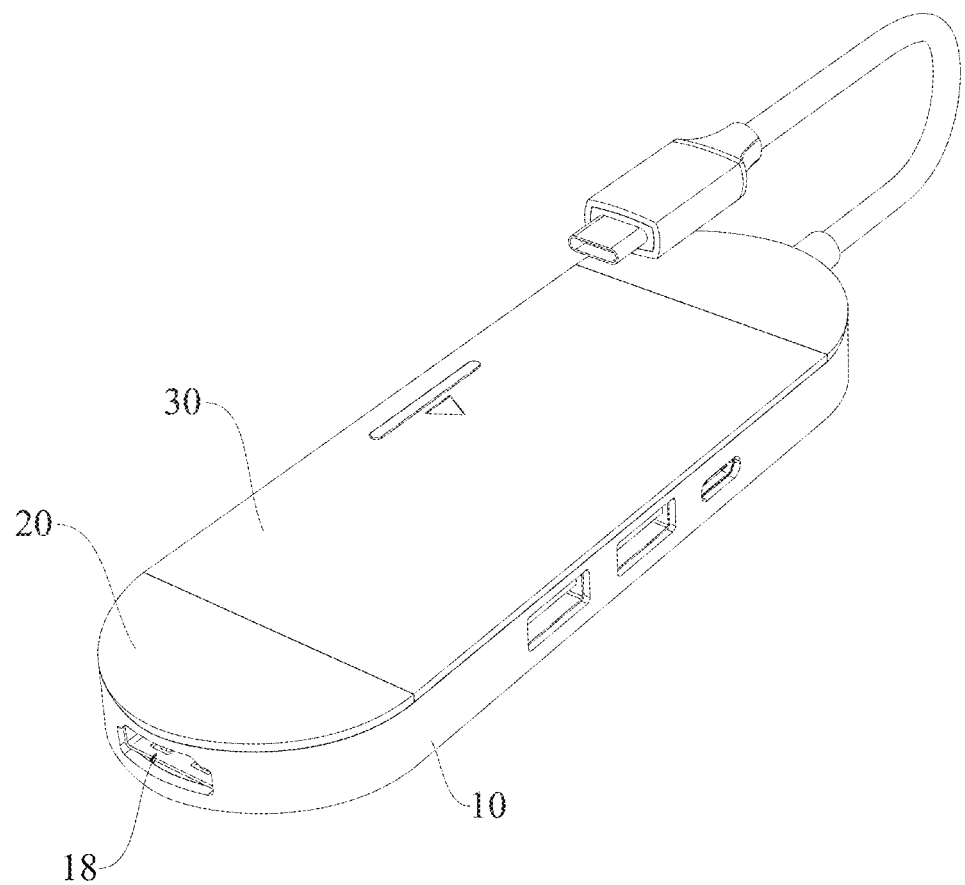
FIG. 5 is a schematic structural diagram of an adapter provided in another embodiment of the present application.

With reference to FIG. 5, in other embodiments, the high-definition multimedia interface 18 can also be provided relative to the plug 103, i.e., the plug 103 is connected to the circuit board 50 from one end of the adapter shell 101, and the high-definition multimedia interface 18 is provided at the other end of the adapter shell 101. Optionally, the plug 103 is a TYPE-C interface, and a plurality of mobile storage devices can be connected to the computer or the mobile phone via the TYPE-C interface.

The first annular lateral plate 12 is further provided with a plurality of USB interfaces 17 for plugging of an external flash memory device, and the USB interfaces 17 are positioned between the charging interface 16 and the high-definition multimedia interface 18. Specifically, two USB interfaces 17 are provided, and the two USB interfaces 17 are provided at an interval and are positioned between the charging interface 16 and the high-definition multimedia interface 18.

The adapter 100 further comprises a support shell 40, and the support shell 40 is positioned in the placing cavity 60 and is detachably connected to a second lateral plate and used for fixing and supporting the circuit board 50. Specifically, the support shell 40 is positioned in the second accommodating cavity, the circuit board 50 is connected to the support shell 40 by a threaded connection, and optionally, the circuit board 50 and the support shell 40 can be assembled first and then placed together in the placing cavity 60, thus improving the convenience of assembling the adapter 100.

The above embodiments are merely preferred embodiments of the present application but not intended to limit the present application, and any modifications, equivalent replacements, improvements, etc. made within the spirit and principle of the present application should be included within the scope of protection of the present application.

The invention claimed is:

1. An adapter shell, used for providing a circuit board, the adapter shell comprises:
   a first shell, comprising a first bottom plate and a first annular lateral plate connected to the first bottom plate;
   a second shell, comprising a second bottom plate and a second annular lateral plate connected to the second bottom plate; and
   a sliding plate movably connected to the second bottom plate, the sliding plate and the second annular lateral plate being respectively positioned on two sides of the second bottom plate;
   wherein the first annular lateral plate and the second annular lateral plate are detachably connected to each other in a sleeved manner, the first annular lateral plate and the second annular lateral plate are positioned between the first bottom plate and the second bottom plate to form a placing cavity for providing the circuit board; and a plate face of the second bottom plate is provided with a communication hole in communication with the placing cavity and used for taking and placing parts, and the sliding plate detachably covers a hole opening of the communication hole.

2. The adapter shell of claim 1, wherein the adapter shell further comprises a buckle structure, and the buckle structure detachably connects the first annular lateral plate and the second annular lateral plate.

3. The adapter shell of claim 2, wherein the buckle structure comprises a plurality of female buckles provided on an inner lateral wall of the first annular lateral plate and a plurality of male buckles provided on an outer lateral wall of the second annular lateral plate in a protruding manner, wherein the male buckles are adapted to and in snap connection, on a one-to-one basis, to the female buckles.

4. The adapter shell of claim 1, wherein the plate face of the second bottom plate is provided with a placing groove, the hole opening of the communication hole is positioned at a groove bottom of the placing groove, and the sliding plate is provided in the placing groove and can slide in a reciprocating manner in an extension direction of the placing groove so as to open or close the communication hole.

5. The adapter shell of claim 4, wherein groove walls on two sides of the placing groove are provided with a sliding groove, an extension direction of the sliding groove is the same as the extension direction of the placing groove, the sliding plate comprises a plate body and two sliding blocks provided on two sides of the plate body in a protruding manner, and the sliding blocks are slidably connected to the respective sliding grooves, respectively.

6. The adapter shell of claim 5, wherein groove bottoms of the sliding grooves are provided with positioning protrusion points in a protruding manner, and the sliding blocks are provided with positioning pockets adapted to the positioning protrusion points.

7. The adapter shell of claim 5, wherein the groove width of the sliding groove is less than the plate thickness of the plate body.

8. The adapter shell of claim 5, wherein an outwardly provided plate face of the plate body is flush with an outwardly provided plate face of the second bottom plate.

9. The adapter shell of claim 5, wherein the plate body is provided with a shift block part used for shifting the plate body.

10. The adapter shell of claim 1, wherein the first bottom plate and the second annular lateral plate enclose and form a first accommodating cavity, a cavity opening of the first accommodating cavity is provided with a limiting annular groove, and circumferential plate edges of the second bottom plate abut against the groove bottom of the limiting annular groove towards the top.

11. The adapter shell of claim 1, wherein the first annular lateral plate is provided with a charging interface for plugging of an external power supply.

12. The adapter shell of claim 11, wherein the first annular lateral plate is further provided with a high-definition multimedia interface for plugging of an external display device, and the high-definition multimedia interface and the charging interface are positioned on the same side of the adapter shell.

13. The adapter shell of claim 11 wherein the first annular lateral plate is further provided with a plurality of USB interfaces for plugging of an external flash memory device, and the USB interfaces are positioned between the charging interface and the high-definition multimedia interface.

14. An adapter, comprising:
an adapter shell comprising:
a first shell, comprising a first bottom plate and a first annular lateral plate connected to the first bottom plate;
a second shell, comprising a second bottom plate and a second annular lateral plate connected to the second bottom plate; and
a sliding plate movably connected to the second bottom plate, the sliding plate and the second annular lateral plate being respectively positioned on two sides of the second bottom plate;
wherein the first annular lateral plate and the second annular lateral plate are detachably connected to each other in a sleeved manner, the first annular lateral plate and the second annular lateral plate are positioned between the first bottom plate and the second bottom plate to form a placing cavity; and a plate face of the second bottom plate is provided with a communication hole in communication with the placing cavity and used for taking and placing parts, and the sliding plate detachably covers a hole opening of the communication hole;
a circuit board provided in the placing cavity;
a solid state storage chip positioned in the placing cavity and detachably connected to the circuit board;
a plug configured to connect the circuit board to an external device; and
a cable connecting the plug and the circuit board.

15. The adapter of claim 14, wherein the adapter further comprises a support shell, and the support shell is positioned in the placing cavity and is detachably connected to the second lateral plate and used for fixing and supporting the circuit board.

* * * * *